(12) United States Patent
Sugimoto et al.

(10) Patent No.: US 7,847,296 B2
(45) Date of Patent: Dec. 7, 2010

(54) SILICON CARBIDE SEMICONDUCTOR DEVICE

(75) Inventors: Hiroshi Sugimoto, Chiyoda-ku (JP);
Yoshinori Matsuno, Chiyoda-ku (JP);
Kenichi Ohtsuka, Chiyoda-ku (JP);
Noboru Mikami, Chiyoda-ku (JP);
Kenichi Kuroda, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 316 days.

(21) Appl. No.: 12/066,366

(22) PCT Filed: Apr. 24, 2006

(86) PCT No.: PCT/JP2006/308531

§ 371 (c)(1),
(2), (4) Date: Mar. 10, 2008

(87) PCT Pub. No.: WO2007/032118

PCT Pub. Date: Mar. 22, 2007

(65) Prior Publication Data

US 2009/0134404 A1 May 28, 2009

(30) Foreign Application Priority Data

Sep. 14, 2005 (JP) .............................. 2005-267264

(51) Int. Cl.
*H01L 29/15* (2006.01)

(52) U.S. Cl. .................. 257/77; 257/341; 257/401; 257/502; 257/E29.136; 257/E29.257

(58) Field of Classification Search .................. 257/77, 257/401, 502, 341, E29.136, E29.257
See application file for complete search history.

(56) References Cited

U.S. PATENT DOCUMENTS

| 4,264,857 | A | | 4/1981 | Jambotkar |
| 5,744,826 | A | * | 4/1998 | Takeuchi et al. ............... 257/77 |
| 5,914,500 | A | | 6/1999 | Bakowski et al. |
| 6,133,587 | A | * | 10/2000 | Takeuchi et al. ............... 257/77 |
| 7,381,993 | B2 | * | 6/2008 | Uchida et al. .................. 257/77 |
| 2004/0051136 | A1 | | 3/2004 | Kataoka et al. |

FOREIGN PATENT DOCUMENTS

| EP | 1 065 726 A1 | 1/2001 |
| JP | 9 172187 | 6/1997 |
| JP | 10 107263 | 4/1998 |
| JP | 2000 188406 | 7/2000 |
| JP | 2001-144288 | 5/2001 |
| JP | 2004 79577 | 3/2004 |
| WO | 99 48153 | 9/1999 |

\* cited by examiner

*Primary Examiner*—Long K Tran
(74) *Attorney, Agent, or Firm*—Oblon, Spivak, McClelland, Maier & Neustadt, L.L.P.

(57) ABSTRACT

On a major surface of an n-type silicon carbide inclined substrate (2) is formed an n-type voltage-blocking layer (3) made of silicon carbide by means of epitaxial growth. On the n-type voltage-blocking layer (3) is formed a p-type silicon carbide region (4) rectangular when viewed from above. On the surface of the p-type silicon carbide region (4) is formed a p-type contact electrode (5). In the p-type silicon carbide region (4), the periphery of the p-type silicon carbide region (4) that is parallel with a (11-20) plane (14a) of the silicon carbide crystal, which is liable to cause avalanche breakdown, is located on the short side. In this manner, the dielectric strength of a silicon carbide semiconductor device can be improved.

8 Claims, 5 Drawing Sheets

SILICON CARBIDE SEMICONDUCTOR DEVICE

TECHNICAL FIELD

The present invention relates to a silicon carbide semiconductor device, and more particularly, it relates to a silicon carbide semiconductor device controlling high-current power with a high voltage.

BACKGROUND ART

In a power semiconductor device controlling electric power, an element having a symmetrical structure in a semiconductor substrate surface is generally formed in view of equalizing breakdown electric field strength or the like. In other words, the element is so laid out that the shape of the element is symmetrical (line-symmetrical or point-symmetrical) when the semiconductor substrate is viewed directly from above. The element is formed on a prescribed crystal growth layer grown on the surface of the semiconductor substrate. When the angle (offset angle) formed by the substrate surface and a crystal plane in the crystal growth is 0 degrees in the semiconductor substrate, the angle formed by the surface of the crystal growth layer epitaxially grown on the surface of the semiconductor substrate and the crystal plane of the crystal growth layer is 0 degrees. Therefore, it follows that the symmetry of the shape of the element formed on the crystal growth layer is reflected and an element structure also three-dimensionally symmetrical is obtained.

In a semiconductor device employing SiC (silicon carbide) as the semiconductor device, however, it does not follow that a symmetrical element structure is obtained in three-dimensional structure in consideration of substrate crystal orientation even if the element shape is laid out to be line-symmetrical when the semiconductor substrate is viewed directly from above, since the crystal plane of SiC has no plane symmetry and an inclined substrate whose surface forms an angle of several degrees with the crystal plane is employed due to limitation on the conditions for epitaxial growth of SiC.

Considering surfaces (sidewalls or side surfaces of the periphery) extending in the depth direction of an implantation region constituting a diode or the like, for example, the directions of electric fields formed in voltage application on parallel surfaces of the periphery opposite to each other in the direction of inclination corresponds to the directions of crystal plane orientations whose crystal orientations are different from each other by 180 degrees. Considering the sidewalls of the periphery located on the downstream side and the upstream side of the direction of inclination respectively, it follows that the angles formed with the crystal plane vary with the sidewall located on the downstream side and the sidewall located on the upstream side. Patent Document 1 is cited as a document disclosing such a semiconductor device employing SiC.

Patent Document 1: Japanese Patent Laying-Open No. 2000-188406

DISCLOSURE OF THE INVENTION

Problems to be Solved by the Invention

In a semiconductor device employing SiC, breakdown electric field strength varies with the crystal plane orientation. In a semiconductor device employing an inclined substrate whose surface and a crystal plane are angled, therefore, breakdown may take place on a portion located on one side of the direction of inclination with a lower voltage than the portion on the other side of the direction of inclination in a region provided with an element, even if the element is laid out to be symmetrical when the semiconductor substrate is viewed directly from above. Therefore, the performance of the semiconductor device is disadvantageously reduced.

The semiconductor device of SiC includes a relatively large number of defects, whereby the ratio of these defects introduced into the element is increased. Particularly when these defects are located on the aforementioned region easily causing breakdown, breakdown locally takes place on this portion to break the element or reduce the life of the element, whereby the yield of the semiconductor device is disadvantageously reduced.

The present invention has been proposed in order to solve the aforementioned problems, and an object thereof is to provide a silicon carbide semiconductor device having high dielectric strength and obtaining a high yield.

Means for Solving the Problems

The silicon carbide semiconductor device according to the present invention comprises a silicon carbide inclined substrate having a major surface, a first conductivity type silicon carbide layer and a second conductivity type region. The first conductivity type silicon carbide layer is grown on the major surface of the silicon carbide inclined substrate. The second conductivity type region is formed on the surface of the silicon carbide layer to serve as an element. In the second conductivity type region, the periphery is so formed that an electric field component of the same direction as the plane orientation of a prescribed crystal plane based on avalanche breakdown is smaller than an electric field component of a direction different from the plane orientation of the crystal plane with respect to an electric field formed on the periphery of the second conductivity type region following a voltage applied to the second conductivity type region.

Effects of the Invention

In the silicon carbide semiconductor device according to the present invention, the electric field component of the same direction as the plane orientation of the prescribed crystal plane based on avalanche breakdown is rendered smaller than the electric field component of the direction different from the plane orientation of the crystal plane with respect to the electric field formed on the periphery of the second conductivity type region, whereby avalanche breakdown can be suppressed. Further, the region causing avalanche breakdown is narrowed, a probability of presence of defects or the like in this region is reduced, and breakage of the element and reduction of the life of the element can be reduced, whereby the yield of the silicon carbide semiconductor device can be improved.

DESCRIPTION OF THE REFERENCE SIGNS 1 silicon carbide semiconductor device, 2 silicon carbide inclined substrate, 3 n-type voltage-blocking layer, 4 p-type silicon carbide region, 5 p-type contact electrode, 6 n-type contact electrode, 10 silicon carbide crystal, 11 (0001) plane, 12 (0001) direction, 13, 13a, 13b (11-20) direction, 14, 14a, 14b (11-20) direction, 15 (1-100) direction, 16 direction of inclination, 17 direction perpendicular to direction of inclination, 18 to 20 intersection, 21 electric field.

BEST MODES FOR CARRYING OUT THE INVENTION

First Embodiment

Figure 1:
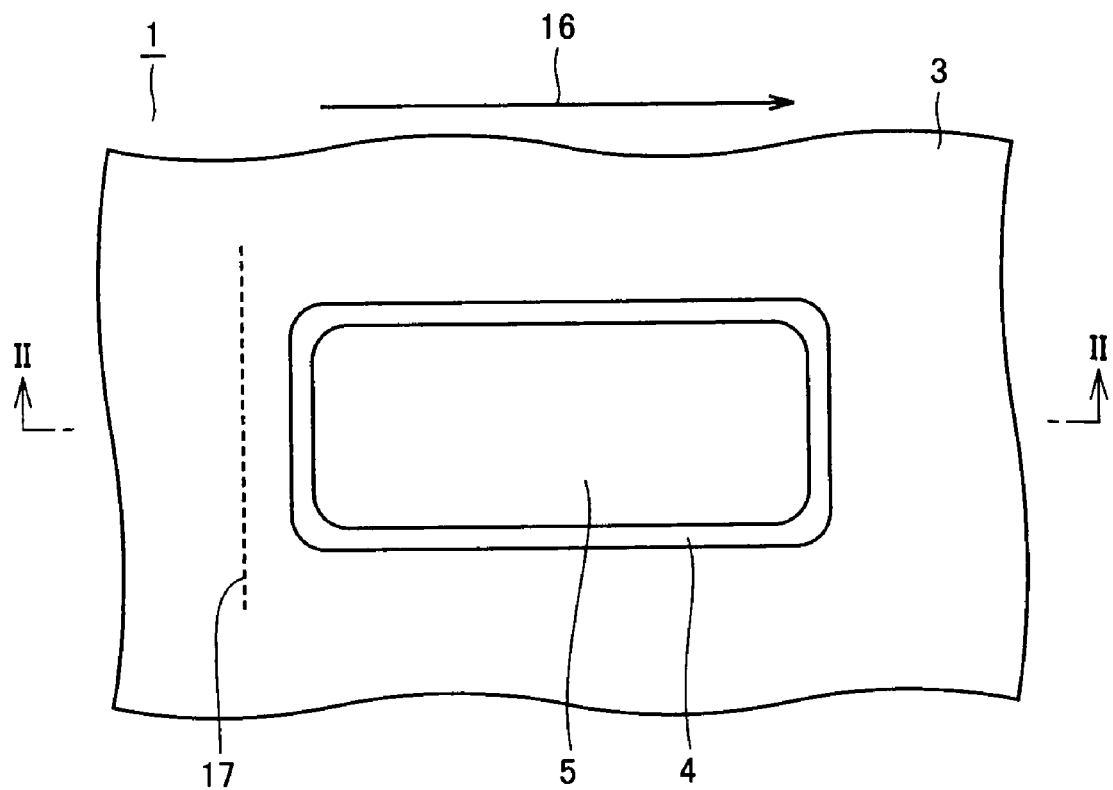
FIG. 1 is a plan view of a silicon carbide semiconductor device according to a first embodiment of the present invention.
Figure 2:
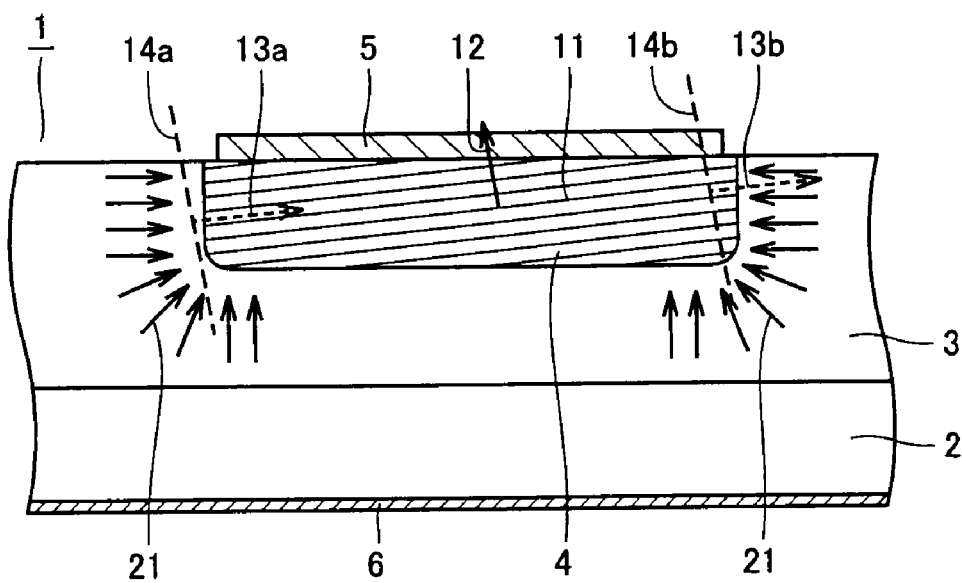
FIG. 2 is a sectional view taken along the sectional line II-II shown in FIG. 1 in the first embodiment.

A silicon carbide semiconductor device according to a first embodiment of the present invention is described with reference to a p-n diode. As shown in FIGS. 1 and 2, an n-type voltage-blocking layer 3 of silicon carbide is formed on the major surface of an n-type silicon carbide inclined substrate 2 by epitaxial growth. A p-type silicon carbide region 4 is formed on n-type voltage-blocking layer 3. A p-type contact electrode 5 is formed on the surface of p-type silicon carbide region 4.

On the other hand, an n-type contact electrode 6 is formed on the back surface of silicon carbide inclined substrate 2. In this silicon carbide semiconductor device 1, the shape of p-type silicon carbide region 4 as viewed directly from above silicon carbide inclined substrate 2 is in the form of an oblong (rectangle), and the corners thereof are rounded in order to suppress electric field concentration. The term "rectangle" or "polygon" used in this specification is not directed to a mathematical rectangle or the like but includes a shape having rounded corners or that resulting from dispersion in manufacturing, for example, and denotes a shape regarded as a rectangle or the like at a glance.

A method of manufacturing the aforementioned silicon carbide semiconductor device 1 is now briefly described. First, n-type silicon carbide inclined substrate 2 whose surface and a crystal plane in crystal growth deviate from each other by a prescribed angle (about several degrees) is prepared. Silicon carbide is grown on the major surface of n-type silicon carbide inclined substrate 2 by epitaxial growth, thereby forming n-type voltage-blocking layer 3.

A p-type impurity is implanted into a prescribed region of n-type voltage blocking layer 3, thereby forming p-type silicon carbide region 4. Thus, it follows that p-type silicon carbide region 4 is formed up to a prescribed depth with the outer shape on the surface. P-type contact electrode 5 consisting of an aluminum layer is formed on the surface of p-type silicon carbide region 4 by sputtering or the like, for example. On the other hand, n-type contact electrode 6 consisting of a nickel layer is formed on the back surface of silicon carbide inclined substrate 2 by sputtering or the like, for example.

Figure 3:
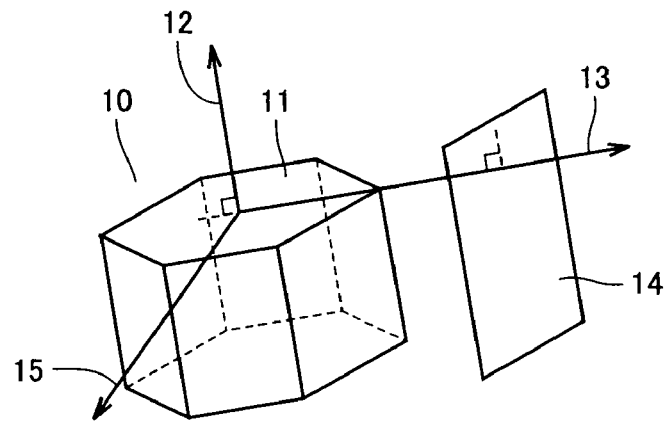
FIG. 3 is a perspective view showing the crystal structure of silicon carbide in the silicon carbide semiconductor device according to the first embodiment.

As shown in FIG. 3, silicon carbide has a crystal structure (hexagonal) 10 in the form of a hexagonal prism. The surface of silicon carbide inclined substrate 2 is so cut along a (11-20) direction 13 corresponding to the direction of inclination of a (0001) crystal plane 11 of silicon carbide as to form an angle of 8 degrees, for example, with crystal plane 11. Therefore, n-type voltage-blocking layer 3 epitaxially grown on the surface of silicon carbide inclined substrate 2 also forms an angle of 8 degrees between (0001) crystal plane 11 of silicon carbide and the surface thereof.

In this silicon carbide semiconductor device, p-type silicon carbide region 4 having the oblong plane shape is so formed on n-type voltage-blocking layer 3 that the long side thereof is parallel to a direction 16 of inclination and the short side is perpendicular to the direction of inclination, as shown in FIG. 1. Direction 16 of inclination is shown as a projection line of (11-20) direction 13 onto the surface of n-type voltage-blocking layer 3.

Figure 4:
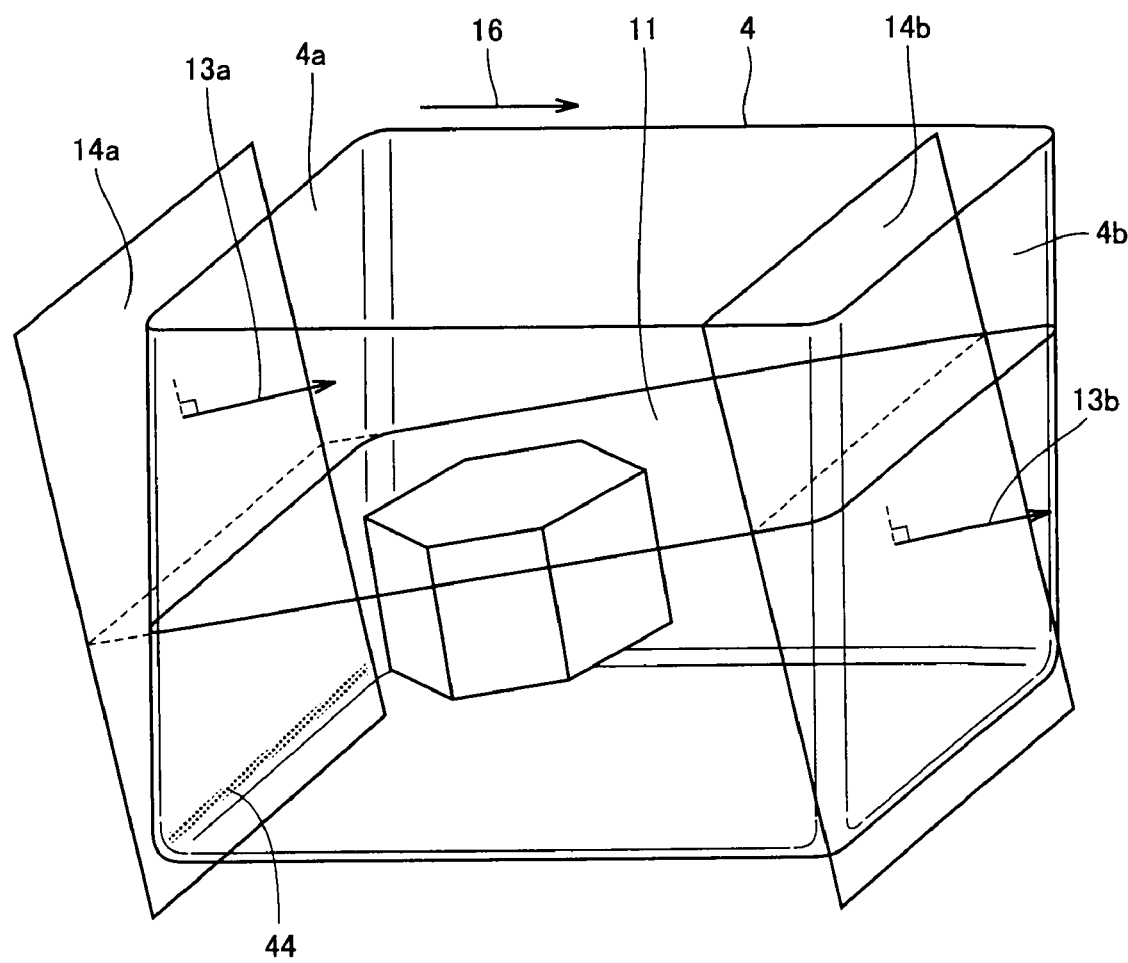
FIG. 4 is a perspective view showing the positional relation between the silicon carbide semiconductor device shown in FIGS. 2 and 3 and crystal planes in the first embodiment.

As shown in FIGS. 2 to 4, a (0001) axis of the silicon carbide crystal forms an angle (8 degrees) corresponding to the angle of inclination with a normal on the surface of silicon carbide substrate 2 or a normal on the surface of n-type voltage-blocking layer 3. Further, (0001) plane 11 of the silicon carbide crystal also forms an angle (8 degrees) corresponding to the angle of inclination with the surface of silicon carbide substrate 2 or the surface of n-type voltage-blocking layer 3. The configurational relation between (11-20) planes 14a and 14b of the silicon carbide crystal and sidewalls (peripheral portions) of p-type silicon carbide region 4 opposed to the direction of inclination varies with a peripheral portion 4a located on the upstream side of the direction of inclination and another peripheral portion 4b located on the downstream side of the direction of inclination.

P-type silicon carbide region 4 is formed over the prescribed depth from the surface of n-type voltage-blocking layer 3 and the sidewalls (side surfaces) constituting the periphery of the p-type silicon carbide region and the bottom (surface) are angled, whereby an electric field 21 easily concentrates on the portions of the corners of the periphery.

The silicon carbide semiconductor device has dependence of crystal planes with respect to avalanche breakdown electric field strength, and a (11-20) plane 14 has lower avalanche breakdown electric field strength as compared with the remaining crystal orientation planes. Further, the silicon carbide semiconductor device includes a portion easily causing dielectric breakdown due to influence by the silicon carbide inclined substrate. P-type silicon carbide region 4 of this silicon carbide semiconductor device is formed by implanting the p-type impurity, whereby the bottom portion of the periphery forms a curved surface having a certain degree of radius of curvature depending on implantation conditions or the like.

Particularly in the configurational relation between the peripheral portion 4a located on the downstream side of the direction of inclination and (11-20) plane 14a of the silicon carbide crystal, therefore, this curved surface partially includes a portion 44 parallel to (11-20) plane 14a, as shown in FIG. 4. In the electric field formed on the periphery of p-type silicon carbide region 4 following a voltage applied to p-type silicon carbide region 4, it follows that an electric field component of the same direction as (11-20) direction 13 of plane orientation of (11-20) plane 14a is formed on parallel portion 44, and this electric field component easily leads to avalanche breakdown.

Further, silicon carbide inclined substrate 2 includes defects such as crystal defects or impurities, whereby it follows that n-type voltage-blocking layer 3 and p-type silicon carbide region 4 also include similar defects with certain area densities. When these defects are partially or entirely present in the aforementioned portion easily causing avalanche breakdown, it follows that the life of the element is shortened or the element is broken, to reduce the manufacturing yield of the element.

In the aforementioned silicon carbide semiconductor device, p-type silicon carbide region 4 having the rectangular plane shape is so formed that the aforementioned portion 44 parallel to (11-20) plane 14a is located on the short side, in order to further narrow portion 44 of the periphery of p-type silicon carbide region 4 parallel to (11-20) plane 14a easily causing avalanche breakdown.

When this is planarly grasped on the surfaces of n-type voltage-blocking layer 3 and p-type silicon carbide region 4, the short side of rectangular p-type silicon carbide region 4 is paralleled to a direction 17 perpendicular to direction 16 of inclination, and the long side is paralleled to direction 16 of inclination. This direction 17 is parallel to the intersection between (11-20) plane 14 and the surface of n-type voltage-blocking layer 3.

Thus, the portion (region) of the periphery of p-type silicon carbide region 4 parallel to (11-20) plane 14 can be further narrowed and the electric field component of the same direction as (11-20) direction 13 of the plane orientation of (11-20) plane 14 can be further reduced with respect to the electric field formed on the periphery of p-type silicon carbide region 4, as compared with the case of such a silicon carbide semiconductor device that the long side of p-type silicon carbide region 4 is parallel to direction 17 perpendicular to direction 16 of inclination. Consequently, avalanche breakdown can be suppressed.

Further, the region easily causing avalanche breakdown is so narrowed that a probability of presence of defects or the like in this region is reduced, and breakage of the element or reduction of the life of the element can be suppressed. Consequently, the yield of the silicon carbide semiconductor device can be improved.

While the aforementioned silicon carbide semiconductor device 1 has been described with reference to the p-n diode employed as the element, the element is not restricted to the p-n diode but the present invention is also applicable to a Schottky diode formed by contact between a semiconductor layer and a metal coat, for example. Further, the aforementioned structure is also applicable to a region constituting a switching element of an MOSFET (Metal Oxide Semiconductor Field Effect Transistor), an IGBT (Insulated Gate Bipolar Transistor) or a thyristor, in addition to the diode.

Further, while the above silicon carbide semiconductor device 1 has been described with reference to the inclined substrate formed by inclining (0001) plane 11 in the silicon carbide crystal in (11-20) direction 13, an inclined substrate formed by inclining a (0001) plane 11 thereof in a (1-100) direction 15 may be applied. In this case, similar effects can be attained by reducing the length on the surface of the sidewall of the silicon carbide region located parallelly to the intersection (direction perpendicular to the direction of inclination) between the (1-100) plane perpendicular to (1-100) direction 15 and (0001) plane 11 perpendicular thereto beyond the length on the surface of the sidewall located parallelly to the direction of inclination.

Second Embodiment

Figure 5:
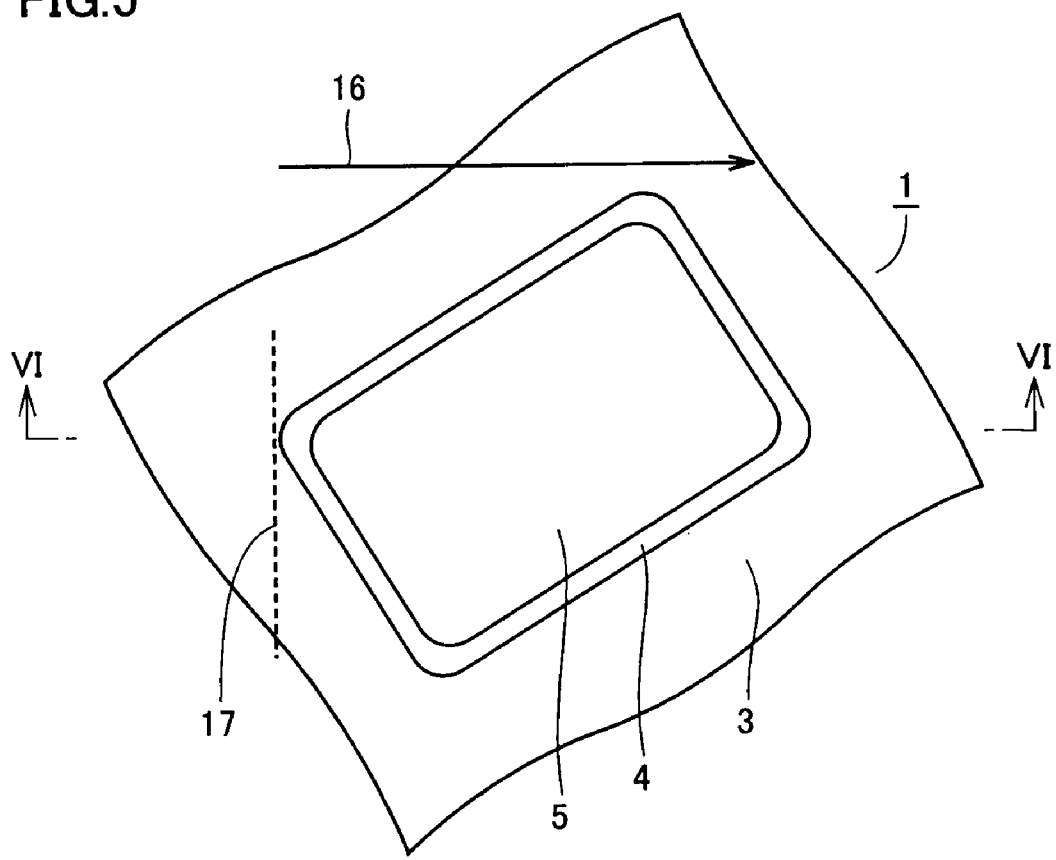
FIG. 5 is a plan view of a silicon carbide semiconductor device according to a second embodiment of the present invention.
Figure 6:
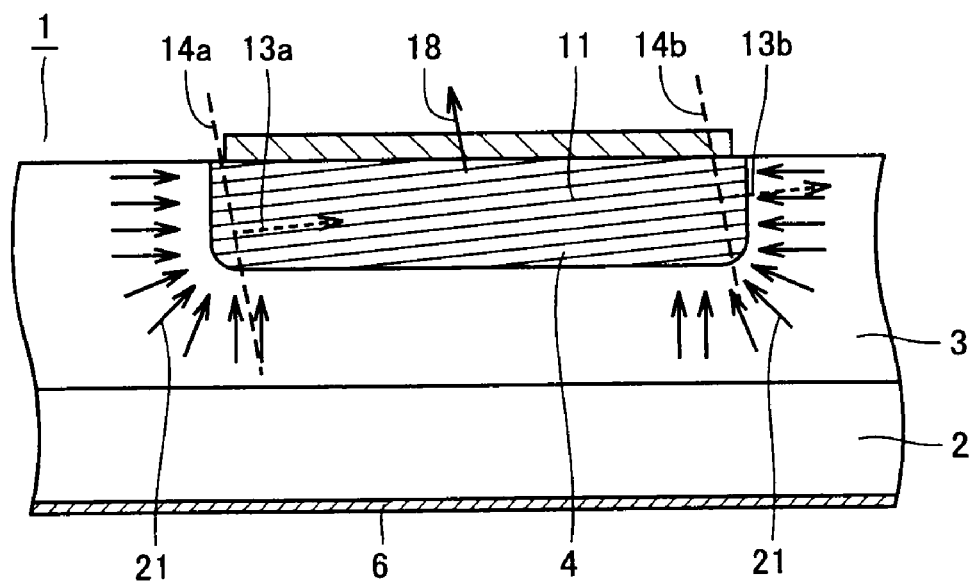
FIG. 6 is a sectional view taken along the sectional line VI-VI shown in FIG. 5 in the second embodiment.

A silicon carbide semiconductor device according to a second embodiment of the present invention is described with reference to another example of a p-n diode. As shown in FIGS. 5 and 6, a p-type silicon carbide region 4 having a rectangular plane shape is so formed on an n-type voltage-blocking layer 3 that both of the long side and the short side thereof intersect with a direction 16 of inclination or a direction 17 perpendicular to the direction of inclination in a silicon carbide semiconductor device 1 according to this embodiment. The remaining structure is similar to the structure of the aforementioned silicon carbide semiconductor device, and hence identical signs are assigned to the same members and redundant description is not repeated.

As described above, an electric field relatively easily concentrates on portions of the corners of the periphery of p-type silicon carbide region 4 formed on p-type voltage-blocking layer 3 by ion implantation. In the silicon carbide semiconductor device, further, a (11-20) plane 14 has lower avalanche breakdown electric field strength as compared with the remaining crystal orientation planes, and the device includes a portion easily causing breakdown due to influence by a silicon carbide inclined substrate.

Therefore, it follows that an electric field component of the same direction as a (11-20) direction 13 of plane orientation of a (11-20) plane 14a is formed in a portion (region) of the periphery of the p-type silicon carbide region having parallel positional relation to (11-20) plane 14, and this electric field component easily leads to avalanche breakdown.

Figure 7:
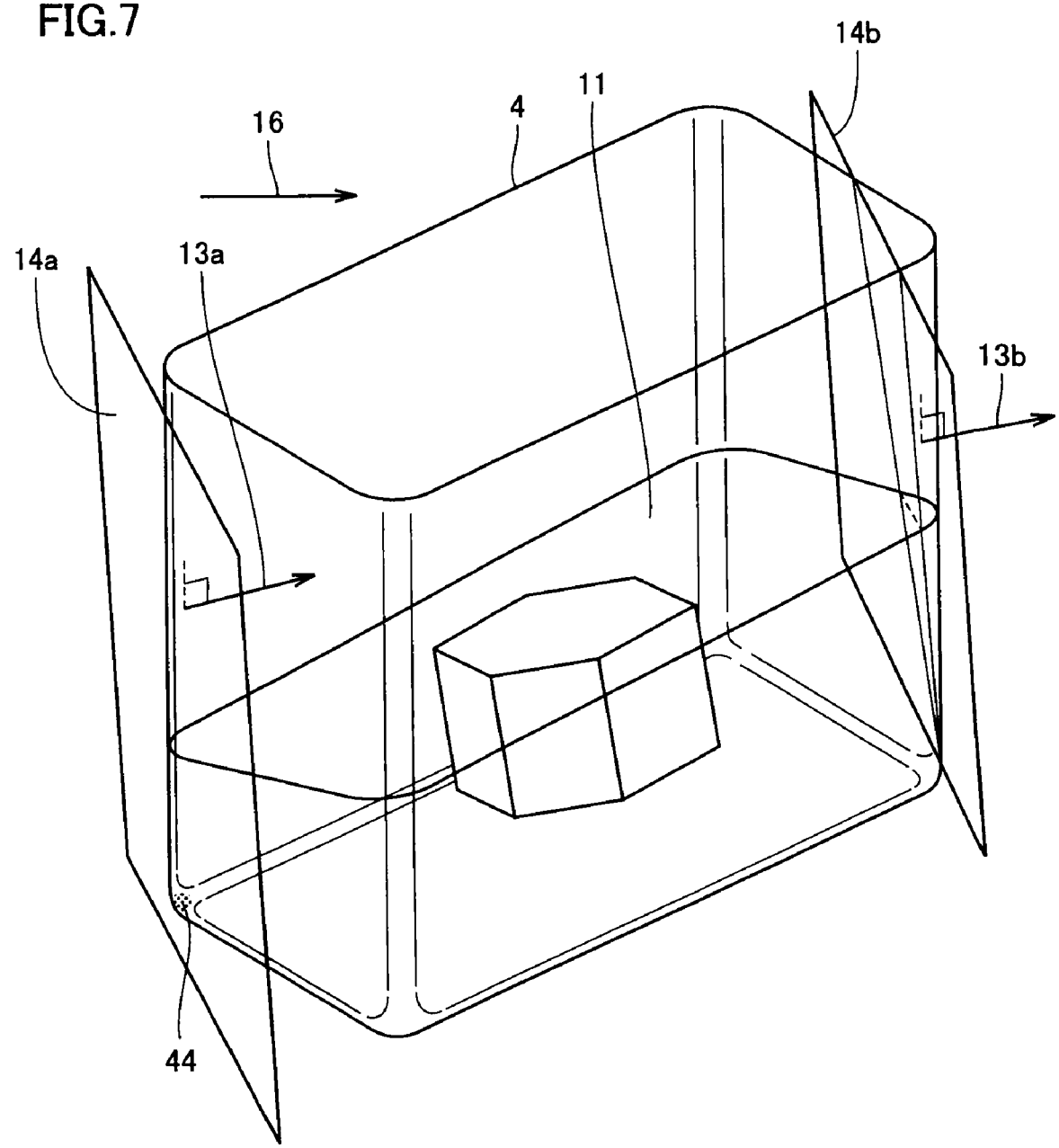
FIG. 7 is a perspective view showing the positional relation between the silicon carbide semiconductor device shown in FIGS. 5 and 6 and crystal planes in the second embodiment.

In silicon carbide semiconductor device 1, p-type silicon carbide region 4 having the rectangular plane shape is so formed that a portion 44 parallel to the aforementioned (11-20) plane 14a is located on the position of one corner included in the four corners of the bottom of the periphery as shown in FIG. 7, in order to further narrow portion 44 of the periphery of p-type silicon carbide region 4 parallel to (11-20) plane 14a easily causing avalanche breakdown.

Thus, the portion (region) of the periphery of p-type silicon carbide region 4 parallel to (11-20) plane 14 can be further narrowed as compared with the case of such a silicon carbide semiconductor device that the long side of p-type silicon carbide region 4 is parallel to direction 17 perpendicular to direction 16 of inclination, and avalanche breakdown can be further suppressed as a result.

Further, the region easily causing avalanche breakdown is so narrowed that a probability of presence of defects or the like is reduced in this region, and breakage of the element or reduction of the life of the element can be further suppressed. Consequently, the yield of the silicon carbide semiconductor device can be further improved.

When a rectangle (oblong) is assumed as the plane shape of the p-type silicon carbide region, the relation between the angle formed by the direction perpendicular to the direction of inclination and the short side of the p-type silicon carbide region and avalanche breakdown (dependence of avalanche breakdown on this angle) is conceivable as follows:

When planarly grasped on the n-type voltage-blocking layer and the surface of the p-type silicon carbide region, the angle formed by the long side of p-type silicon carbide region 4 and direction 17 perpendicular to direction 16 of inclination is smaller than 45 degrees if the angle formed by direction 17 perpendicular to direction 16 of inclination and the short side of p-type silicon carbide region 4 is in excess of 45 degrees (see FIG. 5). Thus, the area of the region of the periphery of p-type silicon carbide region 4 parallel to (11-20) plane 14 may be increased, to easily cause avalanche breakdown. Therefore, configurational relation based on this angle is unpreferable.

Figure 8:
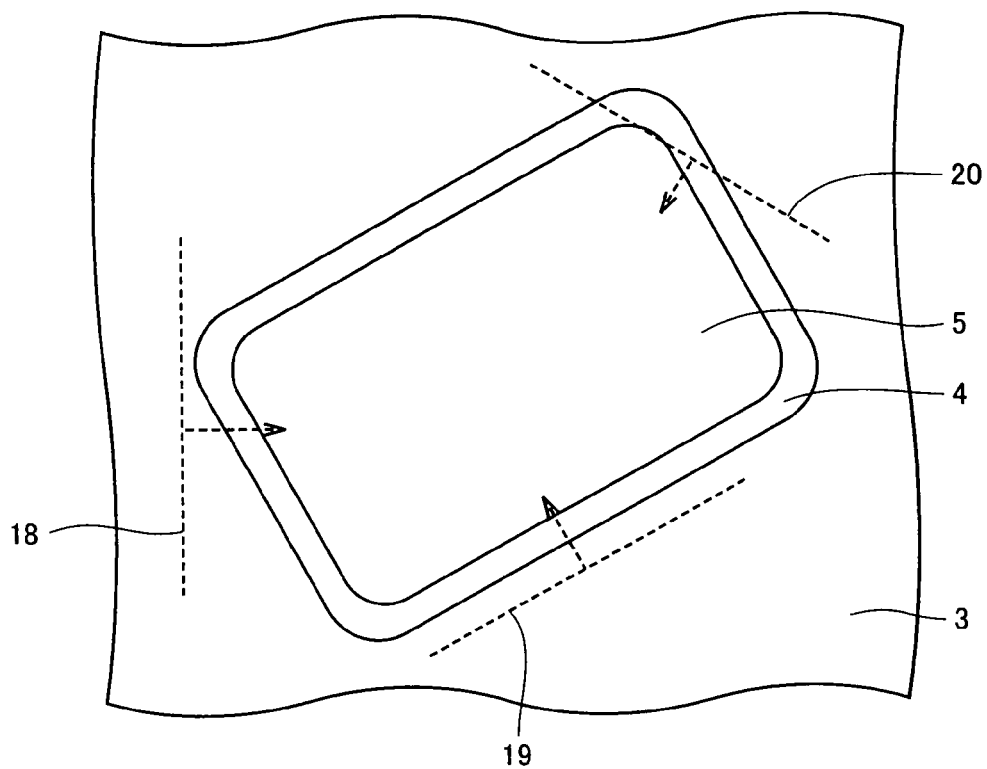
FIG. 8 is a first plan view of the silicon carbide semiconductor device for illustrating prescribed angle dependence of avalanche breakdown in the second embodiment.

When inclination is not taken into consideration, the silicon carbide substrate includes two crystal planes crystallographically equivalent to the (11-20) plane at an angle of 120 degrees with the (11-20). FIG. 8 shows portions where the respective ones of the two planes and the (11-20) plane intersect with the surface of the n-type voltage-blocking layer as intersections. An intersection 18 shows the portion where the (11-20) plane and the surface intersect with each other, and intersections 19 and 20 show portions where the two planes present at the angle of 120 degrees with the (11-20) plane and the surface intersect with each other respectively.

When the angle formed by the short side of p-type silicon carbide region 4 having the rectangular plane shape and intersection 18 to 30 degrees, intersection 19 included in remaining two intersections 19 and 20 is paralleled to the long side. In this case, it follows that the portion parallel to the crystal plane corresponding to intersection 19 is located along the long side on the periphery of p-type silicon carbide region 4. Therefore, avalanche breakdown may easily take place, and the configurational relation of p-type silicon carbide region 4 based on this angle is unpreferable.

Figure 9:
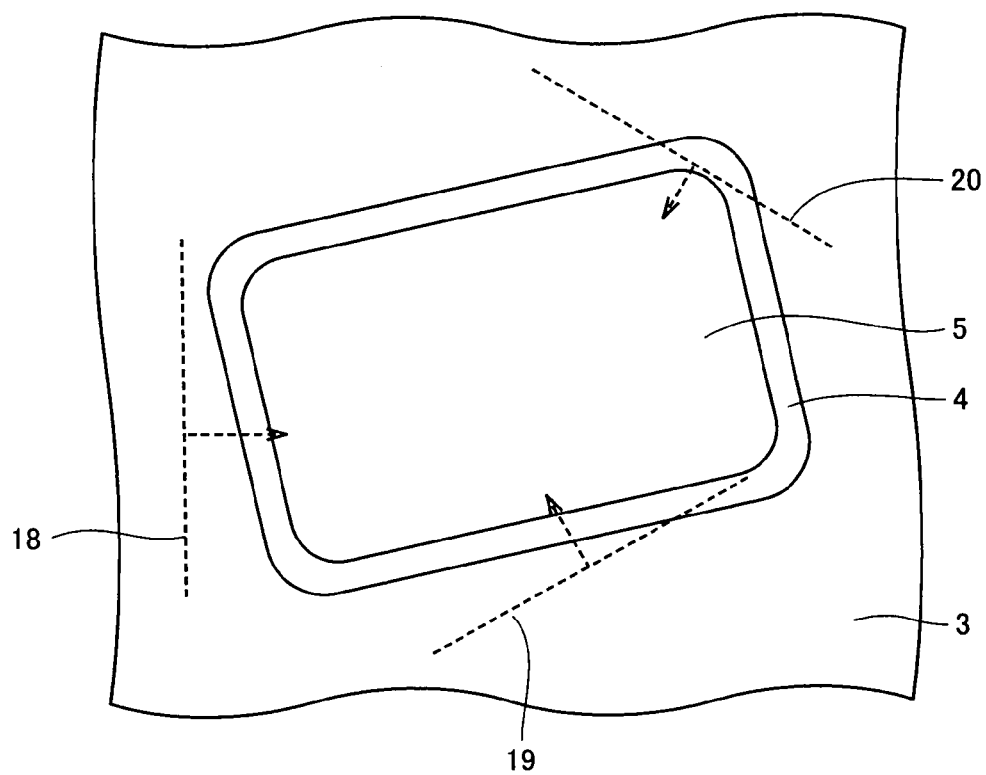
FIG. 9 is a second plan view of the silicon carbide semiconductor device for illustrating prescribed angle dependence of avalanche breakdown in the second embodiment.

Therefore, the angle formed by the short side of p-type silicon carbide region 4 and intersection 18 is so set to 15 degrees that the angle formed by intersection 19 and the long side with respect to one of the two equivalent crystal planes is 15 degrees and the angle formed by intersection 20 and the long side or the short side with respect to the remaining crystal plane is 45 degrees, as shown in FIG. 9. Thus, the number of parallel portions is remarkably reduced with respect to both of the (11-20) plane and the two planes present at the angle of 120 degrees with the (11-20) plane on the periphery of p-type silicon carbide region 4. In view of effectively suppressing avalanche breakdown, therefore, the configurational relation of p-type silicon carbide region 4 based on this angle is conceivably most preferable.

The aforementioned silicon carbide semiconductor device is also applicable to an element region constituting a Schottky diode, a MOSFET, an IGBT or a thyristor, for example, in addition to the p-n diode, as hereinabove described.

Also as to the inclined substrate, similar effects can be attained by applying an inclined substrate formed by inclining the (0001) plane thereof in the (1-100) direction in place of the inclined substrate formed by inclining the (0001) plane in the silicon carbide crystal in the (11-20) direction, as hereinabove described.

While each of the above embodiments has been described with reference to the case where the plane shape of the p-type silicon carbide region constituting the element is in the form of a rectangle (oblong), the plane shape of the p-type silicon carbide region is not restricted to the rectangle, but the same may be substantially polygonal.

Also in this case, avalanche breakdown can be suppressed by paralleling the shortest side of the p-type silicon carbide region to the direction perpendicular to the direction of inclination or forming an n-type voltage-blocking layer so that all of respective sides constituting a polygon intersect with the direction of inclination (or the direction perpendicular to the direction of inclination).

The embodiments disclosed this time are mere examples in all points, and the present invention is not restricted to these. The present invention is shown not in the range described in the above but by the scope of claims for patent, and it is intended that all modifications within the meaning and range equivalent to the scope of claims for patent are included.

INDUSTRIAL APPLICABILITY

The present invention is effectively utilized for a silicon carbide semiconductor device controlling high-current power with a high voltage.

The invention claimed is:

1. A silicon carbide semiconductor device comprising:
   a silicon carbide inclined substrate having a major surface that is inclined relative to a (0001) crystal plane;
   a first conductivity type silicon carbide layer grown on said major surface of said silicon carbide inclined substrate; and
   a second conductivity type region formed on the surface of said silicon carbide layer for serving as an element, wherein
   the periphery of said second conductivity type region is so formed that first electric field strength causing an avalanche breakdown of a same direction as a plane orientation of a prescribed crystal plane is smaller than a second electric field strength causing an avalanche breakdown of a direction different from the plane orientation of said crystal plane with respect to an electric field that is generated when a voltage is applied to said second conductivity type region, and
   a portion of said periphery of said second conductivity type region is arranged to be in parallel to said prescribed crystal plane, the portion being a narrow strip in a curved corner portion of said periphery of said second conductivity type region.

2. The silicon carbide semiconductor device according to claim 1, wherein
   said prescribed crystal plane in said silicon carbide layer is a (11-20) crystal plane perpendicular to the (0001) crystal plane.

3. The silicon carbide semiconductor device according to claim 1, wherein the element is a p-n diode.

4. The silicon carbide semiconductor device according to claim 1, wherein
   said periphery has a plane shape in the form of a polygon on the surface of said silicon carbide layer and said second conductivity type region is formed up to a prescribed depth in said silicon carbide layer.

5. The silicon carbide semiconductor device according to claim 4, wherein
   said second conductivity type region is so formed that an intersection between said prescribed crystal plane and the surface of said silicon carbide layer intersects with the respective sides forming said polygon.

6. The silicon carbide semiconductor device according to claim 5, wherein an angle of the intersection between said prescribed crystal plane and the surface of said silicon carbide layer is 15 degrees.

7. The silicon carbide semiconductor device according to claim 4, wherein
   said second conductivity type region is so formed that an intersection between said prescribed crystal plane and the surface of said silicon carbide layer is parallel to the shortest side among the respective sides forming said polygon.

8. The silicon carbide semiconductor device according to claim 7, wherein
   said plane shape of the periphery is in the form of a rectangle having a long side and a short side, and
   said intersection is so arranged as to be substantially parallel to said short side.

* * * * *